(12) United States Patent
Hirohama et al.

(10) Patent No.: US 6,848,454 B2
(45) Date of Patent: Feb. 1, 2005

(54) METHOD OF MANUFACTURING SEMICONDUCTOR DEVICE

(75) Inventors: Kazuhiro Hirohama, Fukuyama (JP);
Takeshi Umemoto, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 09/988,221

(22) Filed: Nov. 19, 2001

(65) Prior Publication Data

US 2002/0098706 A1 Jul. 25, 2002

(30) Foreign Application Priority Data

Nov. 21, 2000 (JP) ........................................ 2000-354213

(51) Int. Cl.$^7$ ................................................ C25F 5/00
(52) U.S. Cl. .................... 134/1.1; 134/1.2; 134/1.3; 438/723; 438/724; 438/725
(58) Field of Search ............ 134/1.1–1.3; 438/706–714, 438/723–725

(56) References Cited

U.S. PATENT DOCUMENTS

| | | | | |
|---|---|---|---|---|
| 4,529,476 A | * | 7/1985 | Kawamoto et al. | 156/643 |
| 5,817,579 A | * | 10/1998 | Ko et al. | 438/723 |
| 6,177,347 B1 | * | 1/2001 | Liu et al. | 438/675 |
| 6,306,560 B1 | * | 10/2001 | Wang et al. | 438/316 |
| 6,379,574 B1 | * | 4/2002 | Ou-Yang et al. | 216/49 |
| 6,526,996 B1 | * | 3/2003 | Chang et al. | 134/1.3 |

FOREIGN PATENT DOCUMENTS

| | | |
|---|---|---|
| JP | 05-109702 | 4/1993 |
| JP | 05-160077 | 6/1993 |
| JP | 2000-114372 | 4/2000 |

OTHER PUBLICATIONS

Patent Abstracts of Japan Unexamined Patent Publication No. HEI 10 (1998)–256232, published Sep. 25, 1998.

* cited by examiner

*Primary Examiner*—Duy-Vu N. Deo
(74) *Attorney, Agent, or Firm*—Nixon & Vanderhye P.C.

(57) ABSTRACT

A method of manufacturing a semiconductor device including a first step of depositing a first film and a second film on a conductive layer in this order and etching a desired portion of the second film with a first etching gas until the first film is exposed, the first film being made of one of a silicon nitride film and a silicon nitride oxide film, the second film being made of a silicon oxide film, a second step of removing a reaction product deposited on the first film through the first step with a second etching gas to expose the first film, a third step of etching the first film exposed through the second step with a third etching gas until the conductive layer is exposed and a fourth step of removing a reaction product deposited on the conductive layer through the third step with a fourth etching gas, thereby forming a concave portion penetrating the first and second films to reach the conductive layer surface.

15 Claims, 8 Drawing Sheets

(a)

(b)

(c)

(d)

(e)

(f)

(g)

(a)

(b)

(c)

(d)

(e)

(f)

(g)

(h)

(i)

METHOD OF MANUFACTURING SEMICONDUCTOR DEVICE

CROSS-REFERENCE TO RELATED APPLICATION

This application is related to Japanese application No. 2000-354213 filed on Nov. 21, 2000, whose priority is claimed under 35 USC § 119, the disclosure of which is incorporated by reference in its entirety.

BACKGROUND OF THE INVENTION

1. Field of the Invention

The present invention relates to a method of manufacturing a semiconductor device. In particular, it relates to a method of forming a concave portion in an interlayer insulating film comprised of two films: a silicon nitride film or a silicon nitride oxide film at the bottom and a silicon oxide film at the top.

2. Description of Related Art

As semiconductor devices are highly integrated, elements of the semiconductor devices such as transistors are miniaturized. Further, it is getting common to use a layered substrate provided with plural interlayer insulating films and metal wiring layers inserted between interlayer insulating films as a semiconductor substrate for the semiconductor devices.

The layered substrate has contact holes which are opened on the metal wiring layer and reach to the semiconductor substrate through the interlayer insulating film for electrical connection between the metal wiring layer on the interlayer insulating film and the semiconductor substrate.

Further, in order to establish electric connection between upper and lower metal wiring layers, the layered substrate has via holes which are opened on the upper metal wiring layer and reach to the lower metal wiring layer through the interlayer insulating film.

The contact holes and via holes are usually provided by forming openings in the interlayer insulating film made of silicon oxide by etching.

For example, where the semiconductor devices have transistors formed on the semiconductor substrate and the transistors are designed in the order of ¼ micron or smaller, the contact hole is formed to connect to both a source/drain region and a device isolation region of the transistor.

In order to form such a contact hole by etching, attention must be paid so as not to etch the device isolation region made of silicon oxide film. For that purpose, a silicon nitride film of several hundred Å thick is formed as an etch stopper under the interlayer insulating film.

That is, the interlayer insulating film is formed of the silicon nitride film and the silicon oxide film stacked in layers.

Accordingly, to form the contact hole, an opening is formed in both of the silicon oxide film and the silicon nitride film by etching.

Specifically, the silicon oxide film is first etched with an etching gas capable of etching the silicon oxide film at an etching rate higher than that for the silicon nitride film. This etching is stopped at the surface of the silicon nitride film which serves as the etch stopper.

Then, the silicon nitride film is etched with an etching gas capable of etching the silicon nitride film at an etching rate higher than that for the silicon oxide film. Thus, the contact hole is formed.

On the surface of the metal wiring layer, a silicon nitride oxide film is formed as an anti-reflection film used for forming a resist pattern for patterning the metal wiring layer by photolithography.

Accordingly, the interlayer insulating film on the metal wiring layer is formed of the silicon nitride oxide film and the silicon oxide film stacked in layers.

That is, in order to form the via hole, an opening is formed in both of the silicon oxide film and the silicon nitride oxide film by etching.

Specifically, the silicon oxide film is first etched with an etching gas capable of etching the silicon oxide film at an etching rate higher than that for the silicon nitride oxide film, and then the silicon nitride oxide film is etched with an etching gas capable of etching the silicon nitride oxide film at an etching rate higher than that for the silicon oxide film. Thus, the via hole is formed.

In order to form the contact hole or via hole, it is necessary to etch the silicon oxide film formed on the silicon nitride film or silicon nitride oxide film with an etching gas showing higher selectivity to the silicon oxide film than to the silicon nitride film or the silicon nitride oxide film. In this case, generation of an excess of fluorine ions and fluoric radicals must be prevented, so that $C_4F_8$, $C_5F_8$ or the like having high C/F atomic ratio is used as the etching gas.

Where the silicon oxide film is etched using such an etching gas, however, a reaction product such as fluorocarbon is generated and deposited at the bottom of the hole when the silicon nitride film or silicon nitride oxide film is exposed.

In the case of forming the contact hole through the silicon nitride film or the silicon nitride oxide film by etching, an etching gas showing higher selectivity to the silicon nitride film or the silicon nitride oxide film than to the underlying silicon substrate or silicon oxide film of the device isolation region is used. Further, in the case of forming the via hole in the same manner, an etching gas showing higher selectivity than to the underlying metal wiring layer is used.

However, also in the case of etching the silicon nitride film or the silicon nitride oxide film with such an etching gas, a reaction product such as fluorocarbon is deposited at the bottom of the resulting hole.

If a metal plug of W or Cu is formed in the thus formed contact hole or via hole in which the fluorocarbon reaction product remains, contact resistance or via resistance increases, which results in reduction of LSI wiring reliability and yield of the devices.

To deal with such a problem, commonly known is a method of forming the metal plug after removing the fluorocarbon reaction product from the bottom of the resulting contact hole or via hole using an exfoliative washing solution.

Further, also known is a method comprising a pretreatment of removing the reaction product from the bottom of the hole using plasma containing argon, hydrogen and oxygen performed before sputtering a barrier metal in the process of forming the metal plug (see Japanese Unexamined Patent Publication No. HEI 10 (1998)-256232).

If the reaction product is removed with the washing solution, however, it will be difficult to wash away the washing solution as the aspect ratio of the contact hole or via hole increases. Accordingly, the metal plug may possibly be formed in the hole in which the washing solution remains.

Where the metal plug is formed in the hole in which the washing solution remains, the washing solution is thermally reacted with the underlying silicon or metal wiring material with the help of heat generated by the formation of a tungsten film as the metal plug, and converted to a non-conductive film.

Further, in the case where the reaction product is removed by the pretreatment using the plasma, the wafer is taken out of an etching system used for forming the contact hole or via hole, exposed to atmospheric air, and then introduced to a system for the pretreatment before the barrier metal sputtering.

When the wafer is exposed to the atmospheric air, the reaction product deposited at the bottom of the hole is reacted with moisture in the atmosphere and converted into a film which is difficult to remove. Accordingly, complete removal of the reaction product would be difficult.

SUMMARY OF THE INVENTION

In view of the problems described above, the present invention has been achieved to provide a method of manufacturing a semiconductor device capable of forming a concave portion by etching, while completely and efficiently removing the reaction product deposited at the bottom of the concave portion.

The present invention provides a method of manufacturing a semiconductor device comprising: a first step of depositing a first film and a second film on a conductive layer in this order and etching a desired portion of the second film with a first etching gas until the first film is exposed, the first film being made of one of a silicon nitride film and a silicon nitride oxide film, the second film being made of a silicon oxide film; a second step of removing a reaction product deposited on the first film through the first step with a second etching gas to expose the first film; a third step of etching the first film exposed through the second step with a third etching gas until the conductive layer is exposed; and a fourth step of removing a reaction product deposited on the conductive layer through the third step with a fourth etching gas, thereby forming a concave portion penetrating the first and second films to reach the conductive layer surface.

In other words, the present invention provides a method of manufacturing a semiconductor device, wherein a step of removing a reaction product is carried out in the course of a series of etching steps for forming a concave portion in an interlayer insulating film comprised of two films: a silicon nitride film and a silicon oxide film; or a silicon nitride oxide film and a silicon oxide film, thereby completely removing the reaction product deposited at the bottom of the concave portion.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
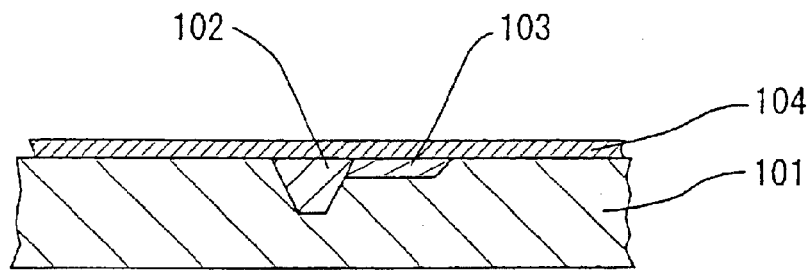
FIGS. 1(a) to 1(d) are views illustrating the steps of forming a contact hole according to Embodiment 1.
Figure 1:
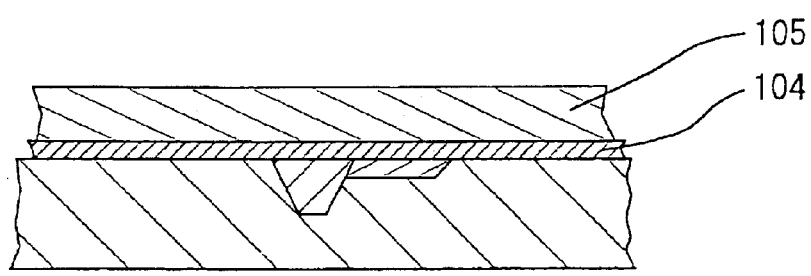
Figure 1:
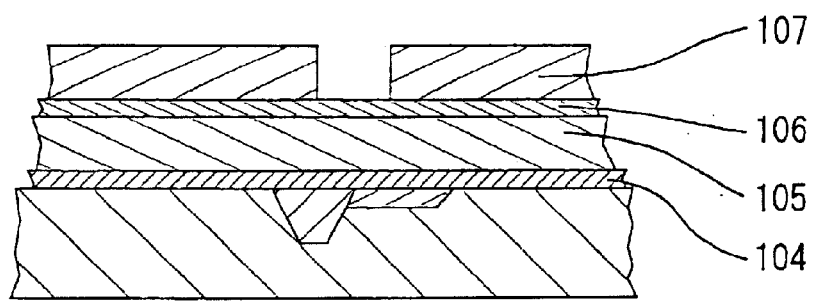
Figure 1:
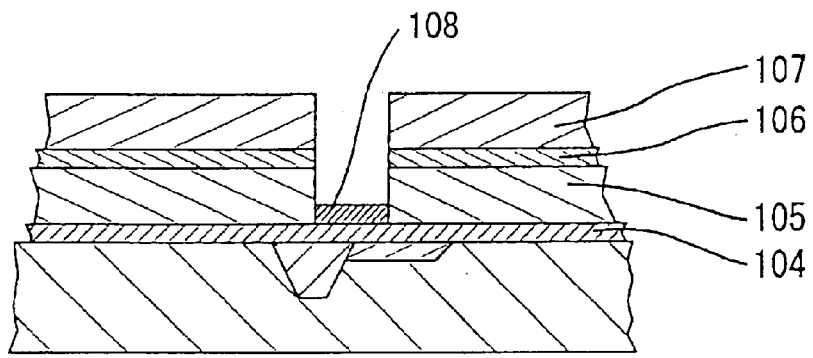

According to the method of the present invention, the term "conductive layer" means a silicon substrate which is doped with impurities, a conductive substrate, a conductive film or the like.

According to the method of the present invention, the silicon nitride film or the silicon nitride oxide film may be formed by, for example, low pressure CVD. The resulting silicon nitride film or silicon nitride oxide film may have a thickness of about 50–100 nm.

Still according to the method of the present invention, the silicon oxide film may be formed by, for example, atmospheric pressure CVD. The resulting silicon oxide film may have a thickness of about 500–1200 nm.

In the method of the present invention, it is preferred to successively carry out the first, second, third and fourth steps in a single apparatus maintaining a vacuum state therein. This prevents the reaction product deposited at the bottom of the concave portion from reacting with moisture in an atmospheric air to convert into a film which is difficult to remove, which allows efficient removal of the reaction product.

According to the method of the present invention, the first etching gas may contain at least one of $CHF_3$, $C_4F_8$ and $C_5F_8$.

Further, the third etching gas may contain at least one of $CHF_3$ and $CH_2F_2$.

Moreover, the second and fourth etching gases may contain $O_2$ and the etching in the second and fourth steps may be carried out under plasma conditions.

That is, in the present invention, an etching gas containing at least $O_2$ is used to remove the reaction product deposited at the bottom of the concave portion.

According to the present invention, the conductive layer may be a silicon substrate and the concave portion may be a contact hole.

Further, various components of a semiconductor device such as electrodes may be formed on the silicon substrate.

According to the present invention, the conductive layer may be a layered substrate on which an electrode is layered and the concave portion may be a via hole.

The layered substrate may include a plurality of interlayer insulating films provided on the silicon substrate and the electrode layer inserted between adjacent interlayer insulating films.

According to the method of the present invention, the step of etching the silicon oxide film is followed by the step of removing the reaction product, and then the step of etching the silicon nitride film or the silicon nitride oxide film is followed by the step of removing the reaction product. Therefore, the reaction product can be removed before they are completely converted into a material which is difficult to remove.

Further, since the etching gas is used for removing the reaction product, an exfoliative washing solution used for the conventional removal will not remain at the bottom of the concave portion.

Therefore, the method of manufacturing the semiconductor device according to the present invention is particularly effective for manufacturing the contact hole or via hole, wherein the complete removal of the reaction product is required.

It goes without saying that the method of the present invention is also applicable to the formation of other concave portions than the contact hole or via hole.

EMBODIMENTS

Hereinafter, the present invention will be detailed with reference to the figures shown below, but the invention is not limited thereto.

Embodiment 1

Figure 2:
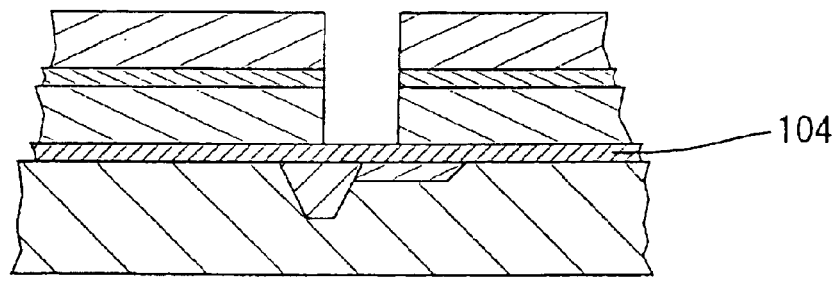
FIGS. 2(e) to 2(g) are views illustrating the steps of forming the contact hole according to Embodiment 1.
Figure 2:
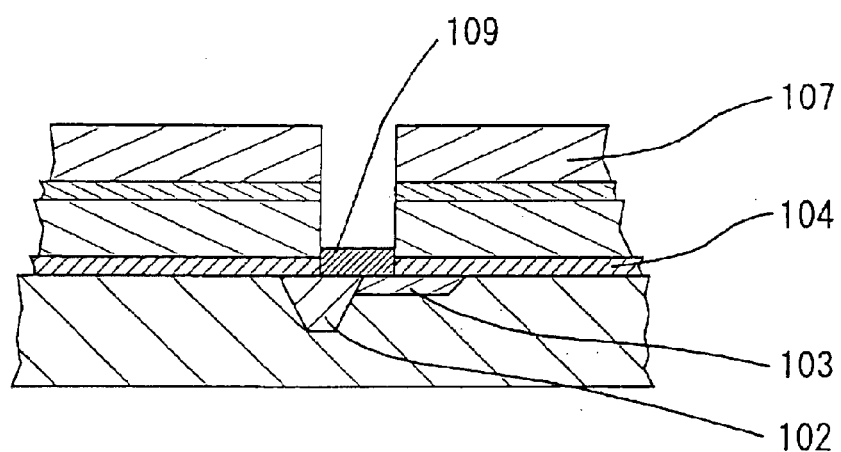
Figure 2:
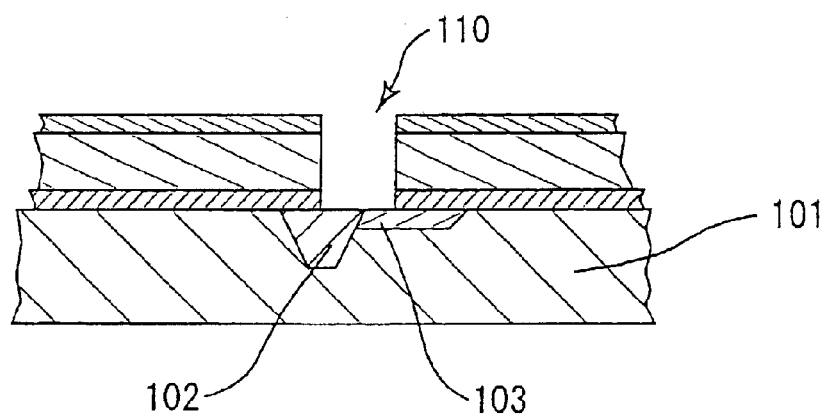

A method of forming the contact hole according to Embodiment 1 will be described with reference to FIGS. 1 and 2. FIGS. 1 and 2 are views illustrating the steps of forming the contact hole according to Embodiment 1.

In this Embodiment, the method of forming the contact hole includes a first step of depositing a silicon nitride film (a first film) 104 and a silicon oxide film (a second film) 105 in this order on a silicon substrate (a conductive layer) 101 and etching a desired portion of the silicon oxide film 105 with a first etching gas until the silicon nitride film 104 is exposed (FIG. 1(d)); a second step of removing a reaction product 108 deposited on the silicon nitride film 104 through the first step with a second etching gas to expose the silicon nitride film 104 (FIG. 2(e)); a third step of etching the silicon nitride film 104 exposed through the second step with a third etching gas until the silicon substrate 101 is exposed (FIG. 2(f)); and a fourth step of removing a reaction product 109 deposited on the silicon substrate 101 through the third step with a fourth etching gas (FIG. 2(g)). Thereby, a contact hole 110 reaching to the surface of the silicon substrate 101 is formed (FIG. 2(g)).

Specifically, as shown in FIG. 1(a), a silicon nitride ($Si_3N_4$) film 104 of about 50 nm thick is formed by low pressure CVD (Chemical Vapor Deposition) on a P-type silicon substrate 101 including a device isolation region 102 formed of a $SiO_2$ field insulating film and a diffusion layer 103.

Then, as shown in FIG. 1(b), a silicon oxide ($SiO_2$) film 105 of about 1200 nm thick is formed on the silicon nitride film 104 by atmospheric pressure CVD. The thus formed silicon oxide film 105 is polished down by a thickness of about 500 nm by CMP (Chemical Mechanical Polishing) for flattening.

Then, as shown in FIG. 1(c), a silicon nitride oxide film 106 of about 60 nm thick is formed on the silicon oxide film 105 by low pressure CVD and a resist pattern 107 is formed on the silicon nitride oxide film 106 by photolithography. In Embodiment 1, the silicon nitride film 104, the silicon oxide film 105 and the silicon nitride oxide film 106 constitute an interlayer insulating film.

The silicon nitride oxide film 106 also functions as an anti-reflection film for forming the resist pattern 107.

Then, with the resist pattern 107 as a mask, the silicon nitride oxide film 106 and the silicon oxide film 105 are etched at an etching rate higher than that for the silicon nitride film 104 as shown in FIG. 1(d) in a RIE (Reactive Ion Etching) system.

The silicon nitride oxide film 106 and the silicon oxide film 105 are etched under the mixture gas plasma conditions, wherein pressure is about 5–10 mTorr, RF power to be applied to an upper electrode (source power) is about 1200–1600 W, RF power to be applied to a lower electrode (bias power) is about 1200–1600 W, and flow rate of the first etching gas is $C_4F_8$: $C_2F_6$:CO:Ar=3–5:8–12:17–23:90–100 sccm.

During this etching, a reaction product 108 of fluorocarbon is deposited on the silicon nitride film 104.

Then, as shown in FIG. 2(e), the fluorocarbon reaction product 108 deposited on the silicon nitride film 104 (FIG. 1(d)) is selectively etched.

The reaction product 108 is etched away under the plasma conditions, wherein pressure is about 15–25 mTorr, RF power to be applied to an upper electrode is about 2300–2700 W, RF power to be applied to a lower electrode is 0 W, and flow rate of the second etching gas is $O_2$=150 sccm.

Then, as shown in FIG. 2(f), the silicon nitride film 104 is etched at an etching rate higher than that for the device isolation region 102 and the diffusion layer 103.

Specifically, the silicon nitride film 104 is etched under the mixture gas plasma conditions, wherein pressure is about 15–25 mTorr, RF power to be applied to an upper electrode is about 1800–2200 W, RF power to be applied to a lower electrode is about 100–200 W, and flow rate of the third etching gas is $CH_2F_2$:$O_2$:Ar=15–20:40–60:70–90 sccm.

During this etching, a reaction product 109 of fluorocarbon is deposited on the device isolation region 102 and the diffusion layer 103.

Then, as shown in FIG. 2(g), the fluorocarbon reaction product 109 deposited on the device isolation region 102 and the diffusion layer 103 (FIG. 2(f)) is selectively etched as shown in FIG. 2(g).

Specifically, the reaction product 109 is etched away under the plasma conditions, wherein pressure is about 15–25 mTorr, RF power to be applied to an upper electrode is about 2300–2700 W, RF power to be applied to a lower electrode is 0 W, and flow rate of the fourth etching gas is $O_2$=150 sccm. Thereafter, the resist pattern 107 (FIG. 2(f)) is removed to complete the contact hole 110.

As described above, the fluorocarbon reaction product 108 is deposited during etching of the silicon nitride oxide film 106 and the silicon oxide film 105, and the fluorocarbon reaction product 109 is deposited during etching of the silicon nitride film 104. However, after the etching of the silicon nitride oxide film 106 and the silicon oxide film 105, and after the etching of the silicon nitride film 104, etching is carried out to remove the reactive products 108 and 109, respectively. As a result, it is confirmed that the reaction products 108 and 109 are readily removed.

Embodiment 2

Figure 3:
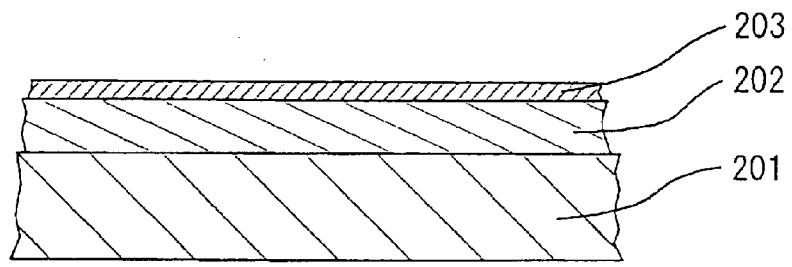
FIGS. 3(a) to 3(d) are views illustrating the steps of forming a via hole according to Embodiment 2.
Figure 3:
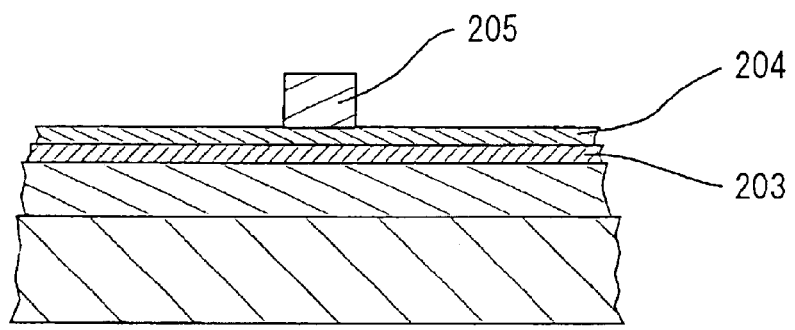
Figure 3:
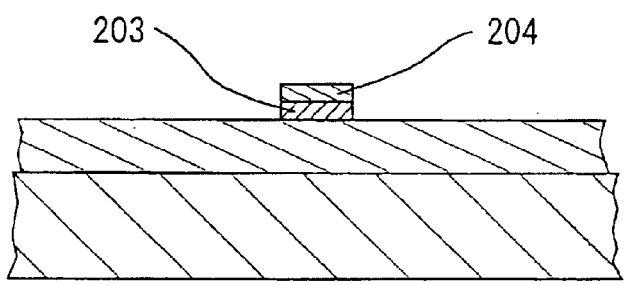
Figure 3:
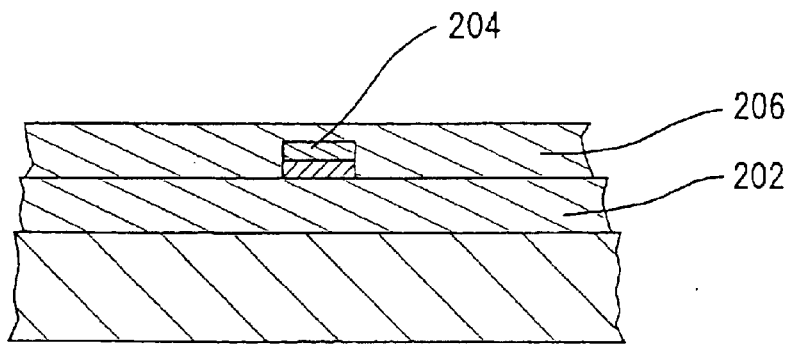
Figure 4:
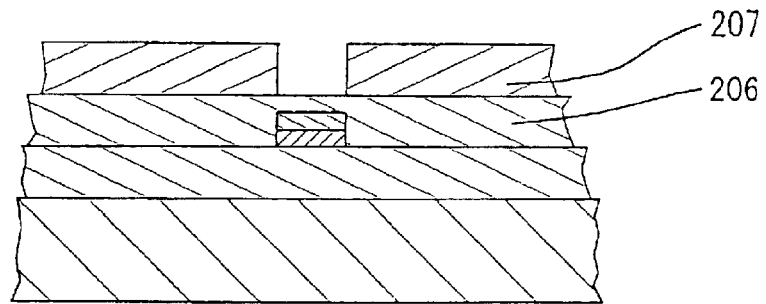
FIGS. 4(e) to 4(g) are views illustrating the steps of forming the via hole according to Embodiment 2.
Figure 4:
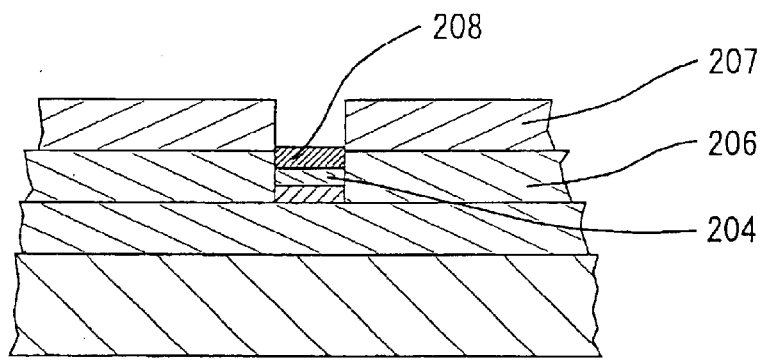
Figure 4:
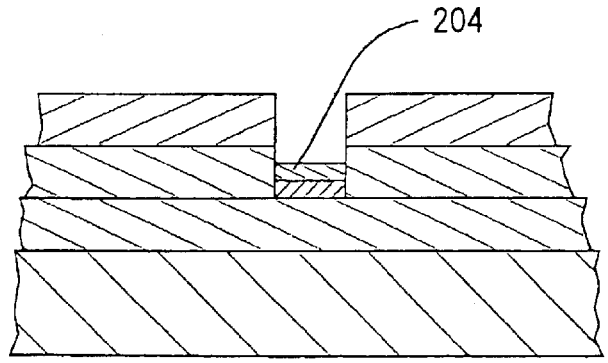
Figure 5:
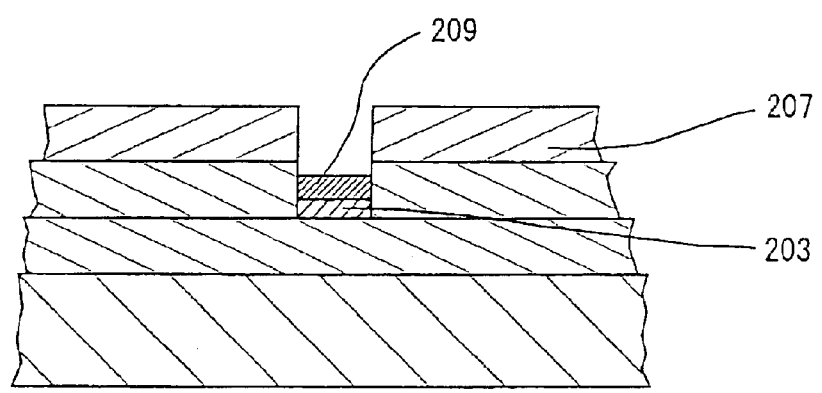
FIGS. 5(h) and 5(i) are views illustrating the steps of forming the via hole according to Embodiment 2.
Figure 5:
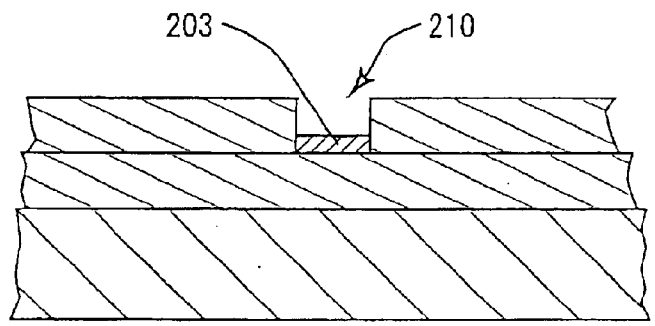

A method of forming a via hole according to Embodiment 2 will be described with reference to FIGS. 3 to 5. FIGS. 3 to 5 are views illustrating the steps of forming the via hole according to Embodiment 2.

As shown in FIGS. 3 to 5, the method of forming the via hole according to Embodiment 2 includes a first step of depositing a silicon nitride oxide film (a first film) 204 and a silicon oxide film (a second film) 206 in this order on a metal wiring layer (a conductive layer) 203 formed on a silicon substrate 201 and etching a desired portion of the silicon oxide film 206 with a first etching gas until the silicon nitride oxide film 204 is exposed (FIG. 4(f); a second step of removing a reaction product 208 deposited on the silicon nitride oxide film 204 through the first step with a second etching gas to expose the silicon nitride oxide film 204 (FIG. 4(g)); a third step of etching the silicon nitride oxide film 204 exposed through the second step with a third etching gas until the metal wiring layer 203 is exposed (FIG. 5(h)); and a fourth step of removing a reaction product 209 deposited on the metal wiring layer 203 through the third step with a fourth etching gas. Thereby, a via hole 210 reaching to the surface of the metal wiring layer 203 is formed.

Specifically, as shown in FIG. 3(a), a titanium nitride (TiN) film, a titanium (Ti) film, an aluminum-copper (Al—Cu) alloy film, a titanium film and a titanium nitride film are deposited in this order on a silicon oxide film 202 to form a metal wiring layer 203.

Then, as shown in FIG. 3(b), a silicon nitride oxide film 204 of about 60 nm thick is formed on the metal wiring layer 203 and a resist pattern 205 is formed on the silicon nitride oxide film 204 by photolithography.

The silicon nitride oxide film 204 also functions as an anti-reflection film for forming the resist pattern 205.

Then, with the resist pattern 205 (FIG. 3(b)) as a mask, the silicon nitride oxide film 204 and the metal wiring layer 203 are etched as shown in FIG. 3(c) in a RIE system (not shown). Thereafter, the resist pattern 205 is removed.

Then, a silicon oxide ($SiO_2$) film 206 of about 1200 nm thick is formed by plasma enhanced CVD as an interlayer insulating film covering the silicon oxide film 202 and the silicon nitride oxide film 204. The thus formed silicon oxide film 206 is polished down by a thickness of about 500 nm by CMP for flattening as shown in FIG. 3(d).

Then, as shown in FIG. 4(e), a resist pattern 207 is formed on the silicon oxide film 206 by photolithography.

Then, with the resist pattern 207 as a mask, the silicon oxide film 206 is etched at an etching rate higher than that for the silicon nitride oxide film 204 as shown in FIG. 4(f) in a RIE system.

Specifically, the silicon oxide film 206 is etched under the mixture gas plasma conditions, wherein pressure is about 3–7 mTorr, RF power to be applied to an upper electrode (source power) is about 1400–1800 W, RF power to be applied to a lower electrode (bias power) is about 1200–1600 W, and flow rate of the first etching gas is $C_4F_8$: $C_2F_6$:CO:Ar=3–7:8–12:8–12:90–100 sccm.

During the etching, a reaction product 208 of fluorocarbon is deposited on the silicon nitride oxide film 204.

Then, as shown in FIG. 4(g), the fluorocarbon reaction product 208 deposited on the silicon nitride oxide film 204 (FIG. 4(f) is selectively etched.

Specifically, the reaction product 208 is etched away under the plasma conditions, wherein pressure is about 15–25 mTorr, RF power to be applied to an upper electrode is about 2300–2700 W, RF power to be applied to a lower electrode is 0 W, and flow rate of the second etching gas is $O_2$=150 sccm.

Then, as shown in FIG. 5(h), the silicon nitride oxide film 204 (FIG. 4(g)) is etched at an etching rate higher than that for the titanium nitride film at the top of the metal wiring layer 203.

Specifically, the silicon nitride oxide film 204 is etched under the mixture gas plasma conditions, wherein pressure is about 15–25 mTorr, RF power to be applied to an upper electrode is about 1800–2200 W, RF power to be applied to a lower electrode is about 100–200 W, and flow rate of the third etching gas is $CH_2F_2$: $O_2$:Ar =15–20:40–60:70–90 sccm.

During the etching, a reaction product 209 of fluorocarbon is deposited on the metal wiring layer 203.

Then, as shown in FIG. 5(i), the fluorocarbon reaction product 209 deposited on the metal wiring layer 203 (FIG. 5(h)) is selectively etched.

Specifically, the reaction product 209 is etched away under the plasma conditions, wherein pressure is about 15–25 mTorr, RF power to be applied to an upper electrode is about 2300–2700 W, RF power to be applied to a lower electrode is 0 W, and flow rate of the fourth etching gas is $O_2$=150 sccm. Thereafter, the resist pattern 207 (FIG. 5(h)) is removed to complete the via hole 210.

As described above, the fluorocarbon reaction product 208 is deposited during etching of the silicon oxide film 206, and the fluorocarbon reaction product 209 is deposited during etching of the silicon nitride oxide film 204. However, after the etching of the silicon oxide film 206, and after the etching of the silicon nitride oxide film 204, etching is carried out to remove the reactive products 208 and 209, respectively. As a result, it is confirmed that the reaction products 208 and 209 are readily removed.

Figure 6:
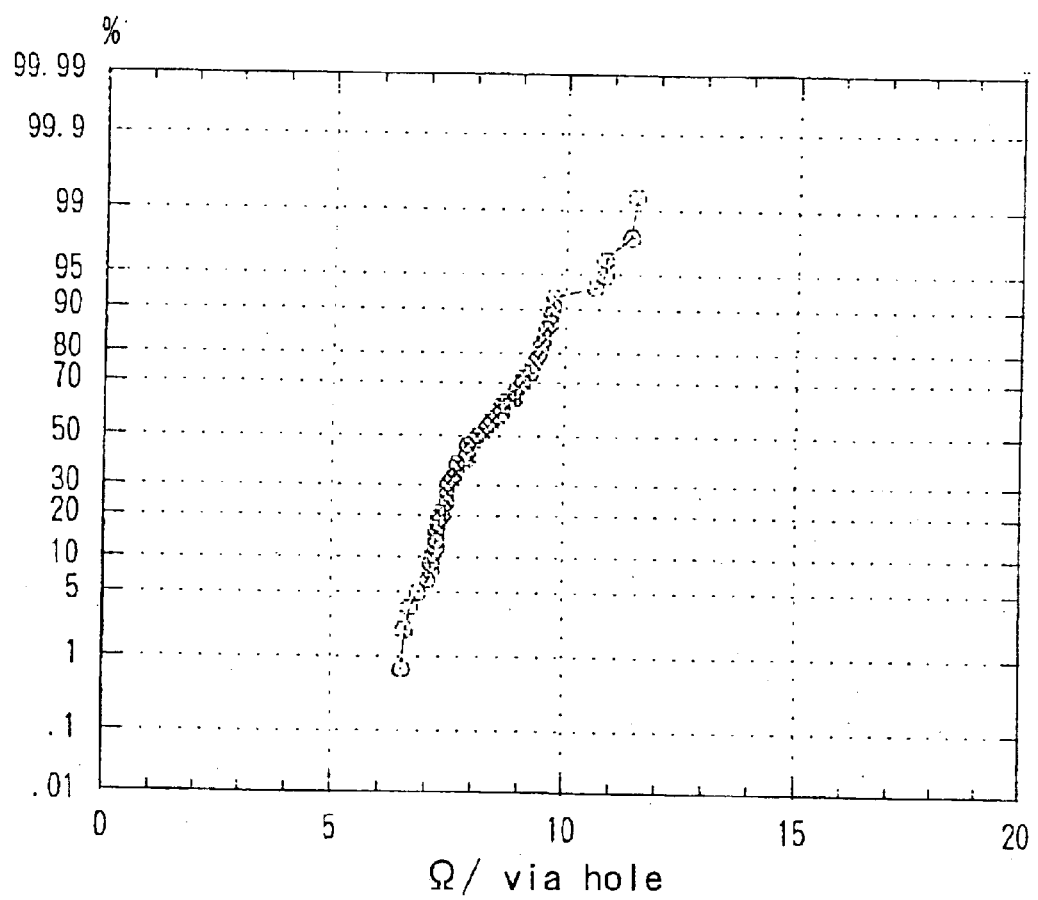
FIG. 6 is a graph illustrating resistance of the via hole formed under the conditions of Embodiment 2.

Next, according to the method of forming the via hole of Embodiment 2, 1000 via holes having a diameter of about 0.26 μm, respectively, are formed and resistance thereof is measured. The conditions for forming them are described in Table 1 below. Measurement results are shown in FIG. 6.

TABLE 1

| | Step | To be etched | Etching conditions |
|---|---|---|---|
| Etching steps for forming via holes (1) | (1) | SiON/P-TEOS film | Pressure = 5 mTorr, Source power = 1900 W, Bias power = 1400 W, $C_4F_8/C_2F_6$/CO/Ar = 4/10/5/95 sccm, 30 sec |
| | (2) | FSG film | Pressure = 5 mTorr, Source power = 1600 W, Bias power = 1400 W, $C_4F_8/C_2F_6$/CO/Ar = 4/10/10/95 sccm, 60 sec |
| $O_2$ plasma treatment (1) | — | Reaction product | Pressure = 600 mTorr, Power = 1200 W, $O_2$ = 500 sccm, 60 sec |
| Etching step for forming via holes (2) | (1) | SiON film | Pressure = 20 mTorr, Source power = 2000 W, Bias power = 200 W, $CH_2F_2/O_2$/Ar = 20/50/80 sccm, 15 sec |
| $O_2$ plasma treatment (2) | — | Reaction product | Pressure = 600 mTorr, Power = 1200 W, $O_2$ = 500 sccm, 60 sec |

According to the conditions shown in Table 1, the $O_2$ plasma treatments (1) and (2) are carried out in a system different from that used for the etching steps (1) and (2).

That is, the wafer is exposed to atmospheric air during transition from the etching step (1) to the $O_2$ plasma treatment (1), and from the etching step (2) to the $O_2$ plasma treatment (2).

However, the etching steps (1) and (2) are followed by the $O_2$ plasma treatments (1) and (2), respectively. Accordingly, the thus formed 1000 via holes show the resistance within a relatively small range from about 6 to 12Ω. In other words, variation of the resistance is relatively inhibited.

Figure 7:
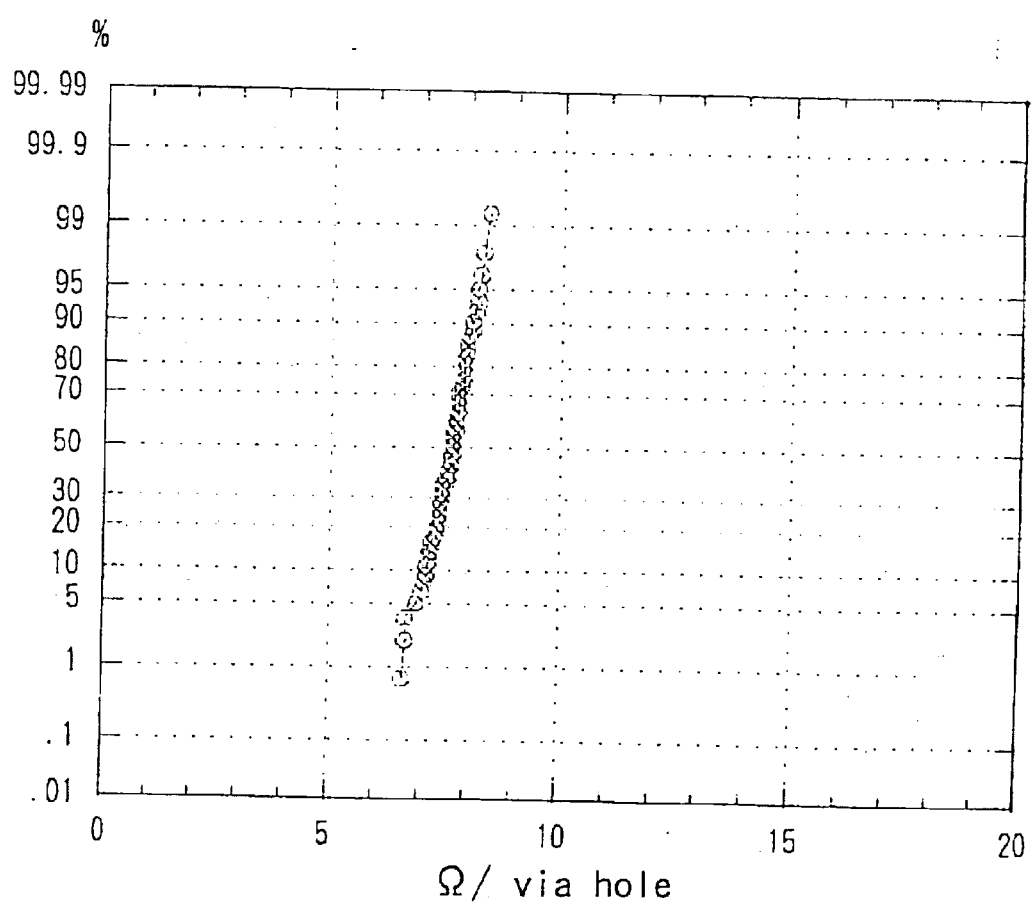
FIG. 7 is a graph illustrating resistance of the via hole formed under the conditions of Embodiment 2.

Then, in the same manner as the above, another 1000 via holes having a diameter of about 0.26 μm, respectively, are formed according to the method of Embodiment 2 except the conditions for forming them are different from those shown in Table 1. The resistance thereof is measured. The conditions for forming them are detailed in Table 2 below and measurement results are shown in FIG. 7.

TABLE 2

| | Step | To be etched | Etching conditions |
|---|---|---|---|
| Etching steps for forming via holes | (1) | SiON/P-TEOS film | Pressure = 5 mTorr, Source power = 1900 W, Bias power = 1400 W, $C_4F_8/C_2F_6/CO/Ar$ = 4/10/5/95 sccm, 30 sec |
| | (2) | FSG film | Pressure = 5 mTorr, Source power = 1600 W, Bias power = 1400 W, $C_4F_8/C_2F_6/CO/Ar$ = 4/10/10/95 sccm, 60 sec |
| | (3) | Reaction product | Pressure = 20 mTorr, Source power = 2500 W, Bias power = 0 W, $O_2$ = 150 sccm, 10 sec |
| | (4) | SiON film | Pressure = 20 mTorr, Source power = 2000 W, Bias power = 200 W, $CH_2F_2/O_2/Ar$ = 20/50/80 sccm, 15 sec |
| | (5) | Reaction product | Pressure = 20 mTorr, Source power = 2500 W, Bias power = 0 W, $O_2$ = 150 sccm, 10 sec |

According to the conditions shown in Table 2, the etching steps (1) to (5) are carried out in a single apparatus maintaining a vacuum state therein.

That is, the steps (3) and (5) for removing the reaction product are carried out in a series of the etching steps, so that the wafer will not be exposed to the atmospheric air during the formation of the via holes. The thus formed 1000 via holes show the resistance within a range from about 6 to 9Ω. That is, the variation of the resistance is more inhibited as compared with the results obtained from the via holes formed under the conditions shown in Table 1.

Comparative Embodiment

Figure 8:
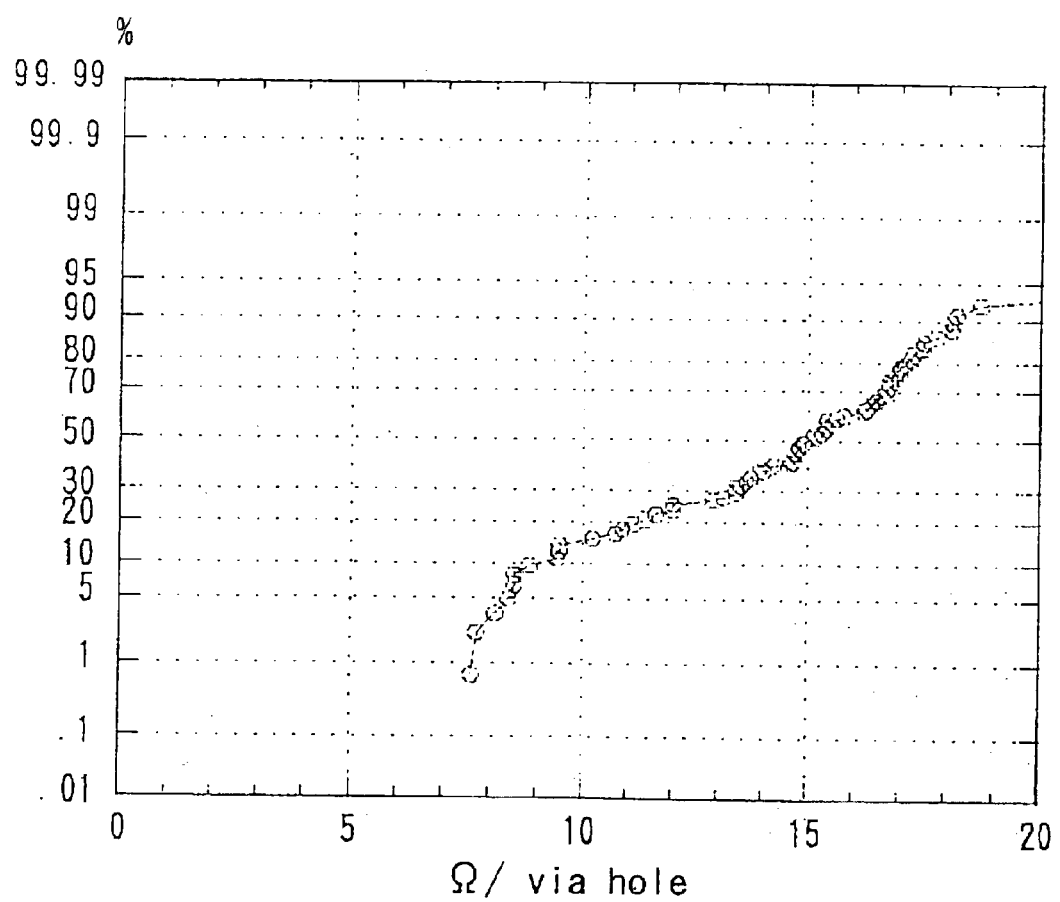
FIG. 8 is a graph illustrating resistance of a via hole formed under the conditions of Comparative Embodiment.

As a comparison with the via holes formed under the conditions shown in Tables 1 and 2, respectively, 1000 via holes having a diameter of about 0.26 μm, respectively, are formed again by a conventional method and the resistance thereof is measured. The conditions for forming them are detailed in Table 3 below and measurement results are shown in FIG. 8.

TABLE 3

| | Step | To be etched | Etching conditions |
|---|---|---|---|
| Etching steps for forming via holes | (1) | SiON/P-TEOS film | Pressure = 5 mTorr, Source power = 1900 W, Bias power = 1400 W, $C_4F_8/C_2F_6/CO/Ar$ = 4/10/5/95 sccm, 30 sec |
| | (2) | FSG film | Pressure = 5 mTorr, Source power = 1600 W, Bias power = 1400 W, $C_4F_8/C_2F_6/CO/Ar$ = 4/10/10/95 sccm, 60 sec |
| | (3) | SiON film | Pressure = 20 mTorr, Source power = 2000 W, Bias power = 200 W, |

TABLE 3-continued

| | Step | To be etched | Etching conditions |
|---|---|---|---|
| | | | $CH_2F_2/O_2/Ar$ = 20/50/80 sccm, 15 sec |
| $O_2$ plasma treatment | — | Reaction product | Pressure = 600 mTorr, Power = 1200 W, $O_2$ = 500 sccm, 60 sec |

According to the conditions of Comparative Embodiment shown in Table 3, the etching steps (1) to (3) are carried out and then the $O_2$ plasma treatment for removing the reaction product is carried out in a different system.

That is, the wafer is exposed to the atmospheric air during transition from the via hole etching steps to the $O_2$ plasma treatment. Accordingly, the reaction product deposited in the via hole is reacted with moisture in the atmospheric air and converted into a film which is difficult to remove. As a result, the reaction product is not completely removed.

The thus formed 1000 via holes show the resistance distributed in a large range from about 7 to 19Ω. The variation of the resistance is greater as compared with the via holes formed under the conditions shown in Tables 1 and 2, respectively.

According to the present invention, a step of etching the silicon oxide film and a step of etching the silicon nitride film or the silicon nitride oxide film are followed by a step of removing the reactive product, respectively. Therefore, the reaction product deposited at the bottom of the concave portion is completely removed with high efficiency.

What is claimed is:

1. A method of manufacturing a semiconductor device comprising:
   a first step of depositing a first film and a second film on a conductive layer in this order and etching a desired portion of the second film with a first etching gas until the first film is exposed, the first film being made of one of a silicon nitride film and a silicon nitride oxide film, the second film being made of a silicon oxide film;
   a second step of removing a reaction product deposited on the first film through the first step with a second etching gas which consists essentially of $O_2$ to expose the first film;
   a third step of etching the first film exposed through the second step with a third etching gas until the conductive layer is exposed; and
   a fourth step of removing a reaction product deposited on the conductive layer through the third step with a fourth etching gas which consists essentially of $O_2$ thereby forming a concave portion penetrating the first and second films to reach the conductive layer surface.

2. A method according to claim 1, wherein the first, second, third and fourth steps are successively carried out in a single apparatus maintaining therein a vacuum state.

3. A method according to claim 1, wherein the first etching gas contains at least one of $CHF_3$, $C_4F_8$ and $C_5F_8$.

4. A method according to claim 1, wherein the third etching gas contains at least one of $CHF_3$ and $CH_2F_2$.

5. A method according to claim 1, wherein the etching in the second and fourth steps is carried out under plasma conditions.

6. A method according to claim 1, wherein the conductive layer is a silicon substrate and the concave portion is a contact hole.

7. A method according to claim 1, wherein the conductive layer is a layered substrate on which an electrode is layered and the concave portion is a via hole.

8. The method of claim 1, wherein the conductive layer is a semiconductor substrate.

9. A method of manufacturing a semiconductor device, the method comprising:

depositing a first film comprising silicon nitride on a conductive layer, and thereafter depositing a second film comprising silicon oxide over the first film comprising silicon nitride;

etching a desired portion of the second film comprising silicon oxide with a first etching gas to form an aperture in the second film, using a second etching gas comprised of $O_2$ to remove a first reaction product deposited on the first film under said aperture defined in the second film, the first reaction product having been formed due to said etching of the second film;

after removing the first reaction product, using a third etching gas to etch the first film at an area where the first reaction product was removed until the conductive layer is exposed thereby forming an aperture in the first film over an exposed area of the conductive layer;

using a fourth gas comprised of $O_2$ to remove a second reaction product deposited on the conductive layer under said aperture defined in the first film, the second reaction product having been formed due to said etching of the first film, thereby forming a concave portion penetrating the first and second films to reach the conductive layer; and wherein at least one of the second and fourth gases consists essentially of $O_2$.

10. A method according to claim 9, wherein all of the recited steps are successively carried out in a single apparatus maintaining therein a vacuum state.

11. A method according to claim 9, wherein the first etching gas comprises at least one of $CHF_3$, $C_4F_8$ and $C_5F_8$.

12. A method according to claim 9, wherein the third etching gas comprises at least one of $CHF_3$ and $CH_2F_2$.

13. A method according to claim 9, wherein the etching using the second and fourth gas(es) is carried out under plasma conditions.

14. A method according to claim 9, wherein the conductive layer is a semiconductor substrate, and the concave portion is a contact hole.

15. A method according to claim 9, wherein the conductive layer is a layered substrate on which an electrode is layered and the concave portion is a via hole.

* * * * *